United States Patent [19]

Kataoka

[11] Patent Number: 5,686,323
[45] Date of Patent: Nov. 11, 1997

[54] METHOD OF MANUFACTURING A SEMICONDUCTOR DEVICE HAVING AN OUT DIFFUSION PREVENTING FILM

[75] Inventor: Yuzo Kataoka, Hiratsuka, Japan

[73] Assignee: Canon Kabushiki Kaisha, Tokyo, Japan

[21] Appl. No.: 203,591

[22] Filed: Feb. 28, 1994

Related U.S. Application Data

[62] Division of Ser. No. 65,049, May 24, 1993, abandoned, which is a continuation of Ser. No. 705,658, May 24, 1991, abandoned.

[30] Foreign Application Priority Data

May 28, 1990 [JP] Japan .................... 2-135422

[51] Int. Cl.$^6$ .................... H01L 21/265; H01L 21/44
[52] U.S. Cl. .................... 437/32; 437/192; 437/200
[58] Field of Search .................... 357/34, 35, 67.5; 257/587, 588, 751, 384, 576, 754, 757, 770; 437/31, 32, 190, 192, 200, 33, 189; 148/DIG. 19, DIG. 147

[56] References Cited

U.S. PATENT DOCUMENTS

| | | | |
|---|---|---|---|
| 4,272,304 | 6/1981 | Komatsu | 437/31 |
| 4,866,001 | 9/1989 | Pickett et al. | 357/35 |
| 4,920,071 | 4/1990 | Thomas | 437/195 |
| 4,960,732 | 10/1990 | Dixit et al. | 437/200 |
| 4,962,414 | 10/1990 | Liou et al. | 357/71 |
| 4,985,750 | 1/1991 | Hoshino | 257/751 |
| 4,987,562 | 1/1991 | Watanabe | 257/751 |
| 4,998,157 | 3/1991 | Yokoyama et al. | 357/65 |
| 5,004,705 | 4/1991 | Blackstone | 437/225 |
| 5,162,262 | 11/1992 | Ajika et al. | 437/200 |

OTHER PUBLICATIONS

Stanley Wolf, *Silicon Processing the VLSI Era*, vol. 2, pp. 121–132, 1990.

*Primary Examiner*—John Niebling
*Assistant Examiner*—Brian K. Dutton
*Attorney, Agent, or Firm*—Fitzpatrick, Cella, Harper & Scinto

[57] ABSTRACT

A method of manufacturing a semiconductor device comprises the steps of:
forming an insulative film onto a semiconductor substrate;
forming openings into said insulative film;
implanting desired impurities into the semiconductor substrate through at least the openings;
forming an out diffusion preventing film onto the surfaces of the semiconductor substrate exposed in at least the opening portions after the impurities have been implanted;
annealing the semiconductor substrate after the out diffusion preventing film has been formed; and
forming a conductive layer onto the out diffusion preventing film.

25 Claims, 3 Drawing Sheets

CONTACT FORMATION (INCLUDING EMITTER)

PATTERNING WITH RESIST

WIRING MATERIAL DEPOSITION & PATTERNING

METHOD OF MANUFACTURING A SEMICONDUCTOR DEVICE HAVING AN OUT DIFFUSION PREVENTING FILM

This application is a division of application Ser. No. 08/065,049 filed May 24, 1994, which is a continuation of application Ser. No. 07/705,658 filed May 24, 1991, each of which are now abandoned.

BACKGROUND OF THE INVENTION

1. Field of the Invention

The present invention relates to a semiconductor device and its manufacturing method and, more particularly, to a semiconductor device in which an emitter region is formed by self alignment by using an emitter electrode lead-out opening portion and to a method of manufacturing such a semiconductor device. The invention typically relates to a semiconductor device of a construction suitable for a bipolar transistor (BPT) which is manufactured by a self aligned emitter and to a method of manufacturing such a semiconductor device.

2. Related Background Art

With progress in the degree of high integration of a semiconductor device, each element constructing the device is made more and more fine. For instance, a bipolar transistor (BPT) can be mentioned as such a device. A self alignment emitter is considered as one means for making the BPT finer.

An example of a method of making a BPT by using a self alignment emitter is ordinarily performed as shown in schematic cross sectional views of FIGS. 1A to 1C. First, a collector region 1 a base region 2 is formed in a semiconductor substrate and, after that, an insulative film 4 between layers is formed. Then, openings 1c, 2c, and 3c are formed in correspondence to regions to be formed as a base region, a collector region, and an emitter region of each element (FIG. 1A).

After that, a resist 7 is opened by a resist patterning so as to form holes of areas which are larger than the areas of the openings 1c and 3c in correspondence to the opening 3c which has been formed in correspondence to the area serving as an emitter region and the opening 1c which has been formed in correspondence to the region serving as a collector region. Impurities are implanted into an emitter forming portion 3 and a collector high concentration forming region 1a by ion implantation (I/I) (FIG. 1B).

After the resist 7 is removed, annealing (thermal treatment) is executed and the impurities implanted into the semiconductor substrate by the ion implantation are activated.

After that, a wiring material 6 is deposited and patterned, thereby forming wirings of the semiconductor device (FIG. 1C).

In the above processing steps, by simultaneously forming the emitter and contact regions, there is no need to provide any alignment margin and the BPT can be made fine.

However, in the above example, it is possible that, upon annealing to activate the impurities which have been ion implanted, the impurities in each of the impurity diffusion regions below the openings are vapor phase diffused (out diffusion) through the openings and the impurity concentrations in the diffusion regions just under the openings decrease, so that a phenomenon such as a rise in contact resistance occurs.

To avoid such a phenomenon, there is considered a method whereby after the contact region is formed as an impurity diffusion region or the like, an oxide film is formed on the impurity diffusion region in the opening portion, to prevent the out diffusion.

In such a case, however, to obtain an ohmic contact between the wiring material and each region before the wiring material is subsequently deposited, the oxide film on the impurity diffusion region must be eliminated. If the oxide film has been eliminated by dry etching, there is the problem that the semiconductor substrate surface maybe damaged by an ion shock and a leakage current between the elements or between the respective regions increases or occurs.

On the other hand, if the oxide film has been eliminated by a wet etching, damage of this type semiconductor substrate surface by the ion shock as in the dry etching does not occur. However, since wet etching is an isotropic etching, if a thickness of oxide film on the impurity diffusion region is large, an opening formed in correspondence to the emitter is larger than an area of the impurity diffusion region used to form the emitter region and, a short-circuit between the emitter and the base may occur. Therefore, there is the problem that the oxide film cannot be made sufficiently thick to ensure, that the out diffusion can be sufficiently prevented. Further, in the case of wet etching, since it is difficult to control an end point of the elimination of the oxide film, there is the problem that variations of characteristics and performances of the elements among the wafers are large.

SUMMARY OF THE INVENTION

The invention is made in consideration of the various problems as mentioned above and it is an object of the invention to solve the problem of the deterioration of the characteristics and performances of the elements due to the out diffusion. It is a further object to provide a semiconductor device, and a method of manufacturing such a semiconductor device, in which there is no need to execute a process to eliminate an out diffusion preventing film by etching or the like before a main wiring layer is formed, so that a defective contact, a leakage of a current between an emitter and a base, and a defective short-circuit which have occurred in association with such an eliminating process can be reduced. It is a further object to produce a semiconductor device such as a BPT or the like in which variations of characteristics and performances of the elements among wafers can be reduced, so that a fine semiconductor device having a high yield can be manufactured.

Another object of the invention is to provide a method of manufacturing a semiconductor device, comprising the steps of: forming an insulative film onto a semiconductor substrate; forming openings into the insulative film; implanting desired impurities into the semiconductor substrate through at least the openings; forming an out diffusion preventing film onto a surface of the semiconductor substrate exposed in at least the openings after the impurities have been implanted; annealing the semiconductor substrate after the out diffusion preventing film has been formed; and forming a conductive layer onto the out diffusion preventing film.

Still another object of the invention is to provide a semiconductor device in which an emitter region is formed by self alignment by using an emitter electrode lead-out opening portion, wherein the device has at least two electrode lead-out wiring layers and the under layer of the wiring layers is also commonly used as an out diffusion preventing film for impurities which have been implanted.

Another object of the invention is to provide a method of manufacturing a semiconductor device in which an emitter region is formed by self alignment by using an emitter electrode lead-out opening portion, wherein after impurities are implanted into a semiconductor layer, a conductive out diffusion preventing film of the impurities is formed on the surface of the semiconductor layer and is annealed and, after that, the preventing film is used as an under layer of a wiring layer, and a main wiring layer is formed on the preventing film.

Another object of the invention is to provide a method of manufacturing a semiconductor device, comprising the steps of: forming regions serving as a base region and a collector region into a semiconductor substrate; forming an insulative layer onto the semiconductor substrate surface after that; forming openings in the insulative layer in correspondence to the regions corresponding to the base region, the collector region, and an emitter region, respectively; forming a resist onto the insulative layer so as to have openings in correspondence to the openings which have been formed in correspondence to the regions serving as the collector region and the emitter region among those openings; implanting impurities into the semiconductor substrate through the openings of the resist and through the openings of the insulative layer; eliminating the resist after that; forming an out diffusion preventing film onto the semiconductor substrate corresponding to at least the opening portions of the insulative layer; annealing the out diffusion preventing film after that; forming a conductive material serving as a wiring material onto the out diffusion preventing film; and patterning the out diffusion preventing film and the conductive material.

DETAILED DESCRIPTION OF PREFERRED EMBODIMENTS

In the invention, before an annealing process (thermal treatment) to activate impurities is executed, a conductive out diffusion preventing film having a high melting point is formed.

That is, in the invention, by forming the out diffusion preventing film, the out diffusion of the impurities from opening portions upon annealing is prevented and, after completion of the annealing, by using the out diffusion preventing film as a wiring layer, the problems that occur when the out diffusion preventing film is an oxide film and must be eliminated by etching or the like can be solved.

In the invention, for the material to make such a conductive out diffusion preventing film, it is possible to use a barrier metal such as TiN, TiW, W, or the like, a silicide film such as $TiSi_2$, $WSi_2$, $MoSi_2$, or the like, or a double-layer structure of a barrier metal and a silicide film such as $TiN/TiSi_2$, $W/WSi_2$, or the like. The invention is not limited to those materials but the out diffusion preventing film can be formed as a plurality of layers of two or more layers.

By using the barrier metal as an out diffusion preventing film, even if wirings made of Al as a main component are used as upper layer wirings, the reaction between Al of a contact portion and Si of an under layer can be suppressed. Thus, an Al spike and an Si precipitation of the contact portion can be prevented and the contact portion can be also made fine.

As mentioned above, according to the method of the invention, a short-circuit between the emitter and the base in association with the eliminating process is prevented and the semiconductor device can be made fine.

Embodiment 1

Figure 1A:
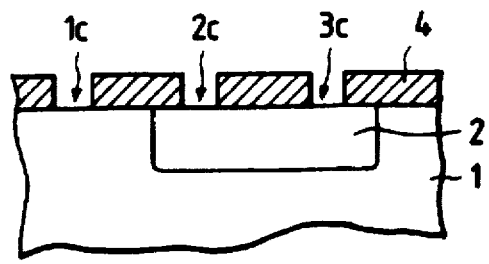
FIGS. 1A to 1C are schematic cross sectional views for explaining an example of manufacturing steps of a prior art BPT using a self alignment emitter, respectively.
Figure 1B:
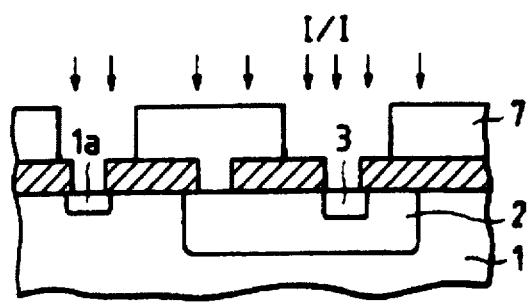
Figure 1C:
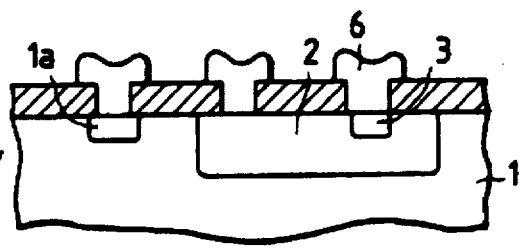
Figure 2:
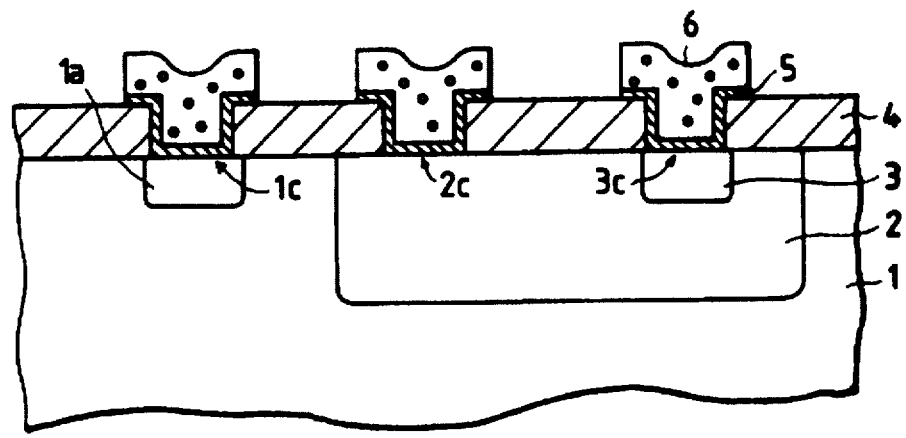
FIG. 2 is a schematic cross sectional view of a semiconductor device (BPT) of the invention.

A preferred embodiment of the invention will be described hereinbelow with reference to the drawings. FIG. 2 is a schematic cross sectional view of a bipolar transistor (BPT) as a semiconductor device of the invention.

In the diagram, reference numeral 1 denotes a collector region; 1a the collector high concentration forming region; 2 the base region; 3 the emitter region formed by self alignment; 1c, 2c, and 3c the contact holes (openings) formed in correspondence to the regions of the collector, base, and emitter, respectively; 4 the insulative film between layers; 5 an out diffusion preventing film (lower wiring layer); and 6 the wiring material (main wiring layer). As shown in the diagram, in the BPT of the invention, the wiring layer has a double-layer structure comprising the out diffusion preventing film 5 also serving as a lower wiring layer 5 and the main wiring layer 6.

FIGS. 3A to 3E are schematic cross sectional views for explaining an example of manufacturing steps of the embodiment shown in FIG. 2, respectively. The manufacturing method of the invention will now be described hereinbelow with reference to FIGS. 3A and 3E.

Figure 3A:
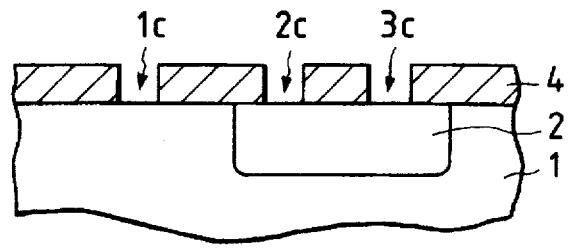
FIGS. 3A to 3E and 4A to 4F are schematic cross sectional views for explaining embodiments of manufacturing steps of the invention, respectively.

First, as shown in FIG. 3A, the insulative film 4 between layers is formed between the collector region 1 of the Si substrate and the base region 2. After that, the contact holes 1c, 2c, and 3c are formed in correspondence to the regions of the collector, base, and emitter, respectively.

Subsequently, the resist 7 is coated and holes are formed in the resist 7 around the contact hole 3c formed in correspondence to the emitter region and in the resist 7 around the contact hole 1c formed in correspondence to the collector region 1 so as to have sizes larger than the sizes of the contact holes 1c and 3c.

Figure 3B:
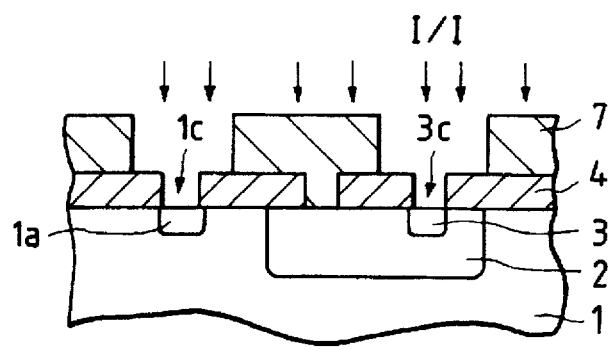

After that, impurities to control a desired conductivity type of As, B, or the like are implanted by ion implantation (I/I). At this time, since each layer functions as a mask on the resist 7 and the insulative film 4, the impurities do not reach the surface of the Si semiconductor substrate at the portions where the resist 7 and the insulative film 4 are formed or in the portion where the insulative film 4 is formed. The impurities are implanted into only the Si semiconductor substrate portions corresponding to the contact holes 1c and 3c as openings portions (FIG. 3B).

Figure 3C:
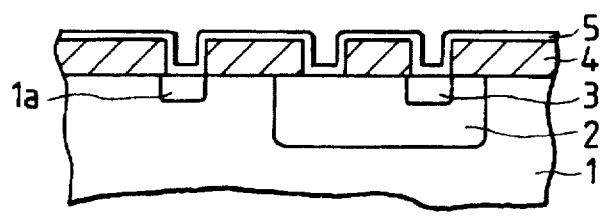

After that, the resist 7 is eliminated and the out diffusion preventing film 5 is formed (FIG. 3C).

The out diffusion preventing film 5 has a high melting point such that it can endure annealing to activate the impurities and has a barrier performance sufficient to prevent the vapor phase diffusion (out diffusion) of the impurities of As, B, or the like under the contact portions during annealing and is, further, also used as a wiring layer. Therefore, it is necessary that the film 5 is made of a conductive material. As an example of materials suitable for the above conditions, TiN, $TiN/TiSi_2$, etc. can be used as mentioned above. It is desirable to set a thickness of film 5 to a value within a range from about 500 to 1000Å.

For instance, in the case of using a TiN film as an out diffusion preventing film 5, as a method of forming such a film, there is a method whereby a Ti target is used, Ar and N₂ gases are used as sputtering gases and are allowed to flow, Ti and N₂ are reacted by a reactive sputtering, and TiN is formed.

On the other hand, in the case where a double-layer film of TiN/TiSi₂ is used as an out diffusion preventing film 5, as a method of forming such a film, there is a method whereby a TiSi₂ target is used, TiSi₂ is deposited, and after that, a Ti target is used, and TiN is formed by a reactive sputtering in an atmosphere containing N atoms. In the above case, a ratio of the film thicknesses between the TiN film and the TiSi₂ film is desirably set to TiN/TiSi₂=¼ to ⅕.

The annealing process (thermal treatment) is executed to activate the impurities. By forming the out diffusion preventing film 5, it is possible to prevent the out diffusion from the impurity diffusion regions under the contact holes which occurs during annealing.

The main wiring layer 6 is subsequently deposited. In the invention, since the out diffusion preventing film 5 is not an insulative oxide film as in the conventional device but a conductive film, the film 5 can be directly used as an under layer of the wiring material. Therefore, the process to eliminate the oxide film used as an out diffusion preventing film in the conventional device is unnecessary. The main wiring material 6 can be directly deposited onto the out diffusion preventing film 5.

Thus, it is possible to eliminate the leakage current between the emitter and the base, the short-circuit therebetween, and the variations of the characteristics and performances of the elements among the wafers which have occurred when the oxide film is eliminated in the conventional device.

Figure 3D:
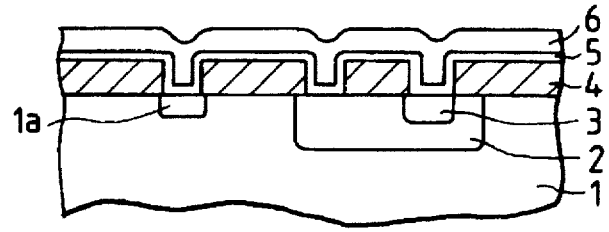
Figure 3E:
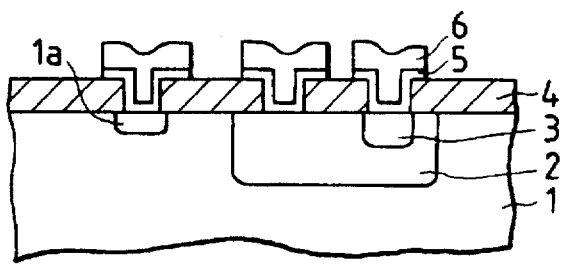

As a main wiring material 6, for instance, an Al-Si (Si of 1%) layer having a thickness within a range from about 0.5 to 1.0 μm is deposited (FIG. 3D).

Subsequently, the main wiring layer 6 and the out diffusion preventing film 5 serving as a lower wiring layer are simultaneously patterned into desired shapes (FIG. 3E), so that the semiconductor device having the structure shown in FIG. 2 according to the invention can be obtained.

Embodiment 2

FIGS. 4A to 4F are schematic cross sectional views for explaining an example of manufacturing steps according to another embodiment of the invention, respectively. A manufacturing method of the invention will now be described hereinbelow with reference to FIGS. 4A to 4F. The embodiment 2 differs from the embodiment 1 with respect to the manufacturing step shown in FIG. 4C and subsequent steps.

Figure 4A:
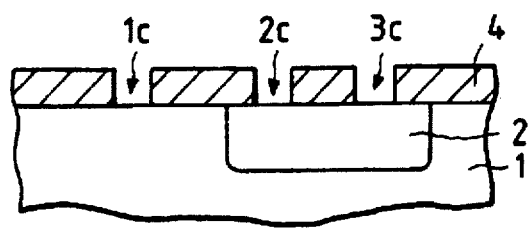

First, as shown in FIG. 4A, the insulative film 4 between layers is formed between the collector region 1 of the Si substrate and the base region 2 and, after that, the contact holes 1c, 2c, and 3c are formed in correspondence to the regions of the collector, base, and emitter, respectively.

The resist 7 is subsequently coated and holes are formed in the resist 7 around the contact hole 3c formed in correspondence to the emitter region and in the resist 7 around the contact hole 1c formed in correspondence to the collector region 1 so as to have sizes larger than the sizes of the contact holes 1c and 3c.

Figure 4B:
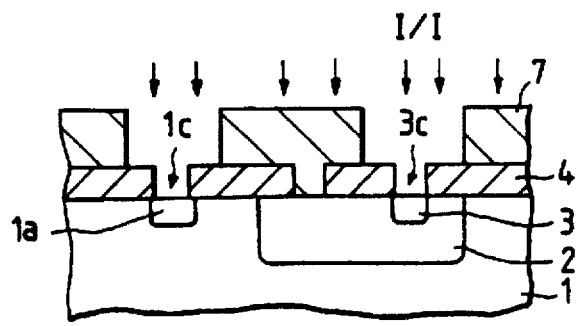

After that, impurities to control a desired conductivity type such as As, B, etc. are implanted by ion implantation (I/I). At this time, on the resist 7 and the insulative film 4, since each layer functions as a mask, the impurities do not reach the surface of the Si semiconductor substrate at the portions where the resist 7 and the insulative film 4 have been formed or in the portion where the insulative film 4 has been formed. The impurities are implanted into only the Si semiconductor substrate portions corresponding to the contact holes 1c and 3c serving as opening portions (FIG. 4B).

Figure 4C:
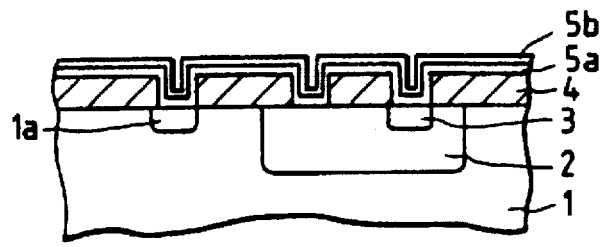
Figure 4D:
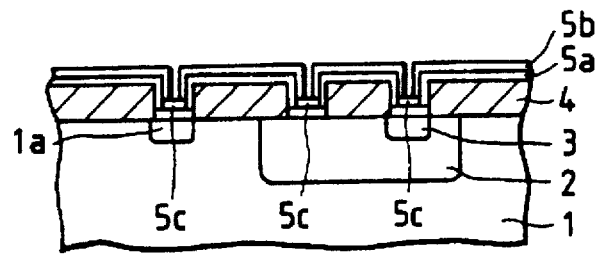

After that, the resist 7 is eliminated and out diffusion preventing films 5a and 5b are formed, respectively, (FIG. 4C).

Each of the out diffusion preventing films 5a and 5b has a high melting point which can endure annealing to activate the impurities and a barrier performance sufficient to prevent the vapor phase diffusion (out diffusion) of the impurities of As, B, etc. under the contact portions during the annealing and is, further, also used as a wiring layer. Therefore, it is necessary that the films 5a and 5b are made of a conductive material. In the embodiment 2, Ti has been used as a material of the film 5a and TiN has been used as a material of the film 5b. It is desirable to set a thickness of film 5a to a value within a range from about 500 to 1000Å.

In the case of using the Ti and TiN films as the out diffusion preventing films 5a and 5b, as a method of forming such films, there is a method whereby a Ti target is used and Ti is formed by sputtering, or a Ti target is used, Ar and N₂ gases are used as sputtering gases and are allowed to flow, Ti and N₂ are reacted by reactive sputtering, and TiN is formed.

In the embodiment, after a Ti layer having a thickness of about 100Å was deposited, a TiN layer having a thickness of about 900Å is subsequently deposited.

Subsequently, annealing to activate the impurities is executed. By forming the out diffusion preventing films 5a and 5b, it is possible to prevent the out diffusion from the impurity diffusion regions under the contact holes which occurs during annealing.

On the other hand, since the Ti layer 5a as an under layer is in contact with Si of the semiconductor, a TiSi₂ layer (5c in the diagrams) having a thickness of about 200Å is formed (FIG. 4D) by annealing. Since the TiSi₂ film 5c also functions as an out diffusion preventing film, it is also referred to as an out diffusion preventing film hereinafter.

The main wiring layer 6 is subsequently deposited. However, in the invention, since the out diffusion preventing films 5a and 5c are not the insulative oxide films as in the conventional device but are conductive films, the out diffusion preventing films 5a and 5c can be directly used as under layers of the wiring material. Therefore, the process to eliminate the oxide films used as out diffusion preventing films in the conventional device is unnecessary and the main wiring material 6 can be directly deposited onto the out diffusion preventing film 5b.

Consequently, it is possible to eliminate the leakage current between the emitter and the base, the short-circuit therebetween, and the variations of the characteristics and performances of the elements among wafers which have occurred upon elimination of the oxide films in the conventional device.

Figure 4E:
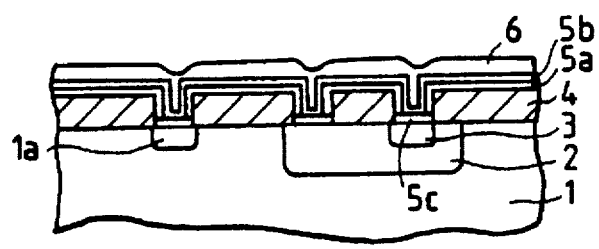
Figure 4F:
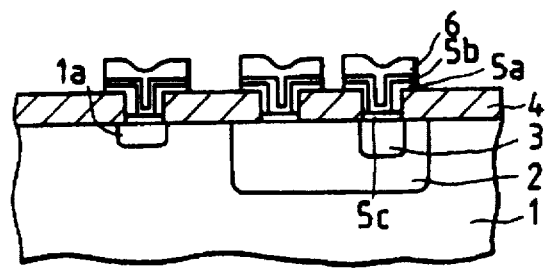

As a main wiring material 6, for instance, an AlSi (Si of 1%) layer having a thickness within a range from about 0.5 to 1.0 μm is deposited (FIG. 4E).

Subsequently, the main wiring layer 6 and the out diffusion preventing films 5a and 5b serving as lower wiring layers are simultaneously patterned into desired shapes (FIG. 4F), so that a semiconductor device of the structure of the invention can be obtained.

Embodiment 3

Explanation will now be made with respect to an example in which the out diffusion preventing films having a construction comprising a plurality of layers of the TiN film and the TiSi$_2$ film which have been described in the embodiment 1 are formed by another method.

In the embodiment 3, Ti has been used as a material of the out diffusion preventing film 5 shown in FIG. 3C). After the Ti film was formed, the impurities are activated by annealing. However, in the embodiment 3, an RTA (Rapid thermal anneal) is executed in the N$_2$ atmosphere. By executing such an annealing, the TiN film is formed on the surface side of the Ti film and the TiSi$_2$ film is formed on the semiconductor side of the Ti film.

As mentioned above, Ti, TiN, and TiSi$_2$ function as out diffusion preventing layer barrier metals and an excellent effect similar to that in the embodiment 1 could be obtained.

According to the embodiment, since the films are formed by using only Ti, not only the film thicknesses and the temperatures can be easily controlled but also the number of processing steps can be reduced as compared with the construction comprising multi-layer films. Further, a device having a stable multi-layer structure comprising TiN/TiSi$_2$ or TiN/Ti/TiSi$_2$ can be finally formed. A management of the manufacturing steps and the like can be also further easily performed.

As described above, according to the semiconductor device and its manufacturing method of the invention, the wiring layers are constructed by at least two layers and the lower wiring layer is formed by conductive film also serving as an out diffusion preventing film of the impurities which have been implanted. Therefore, the process to eliminate the out diffusion preventing film by etching or the like before the main wiring layer is formed as in the conventional method is unnecessary.

Consequently, the defective contact, the leakage current between the emitter and the base, and the defective short-circuit therebetween which have occurred in association with the eliminating process can be reduced. In the BPT, the variations of the characteristics and performances of the BPTs among wafers can be reduced. A fine semiconductor device having a high yield can be manufactured.

Although the above embodiment have been described with respect to the case of using the Si substrate, the invention is not limited to only the Si substrate so long as there is no relation between the preventing film and the semiconductor as in the case of forming TiSi$_2$ from Ti and Si of the embodiment 3. Another semiconductor substrate can be also used within the scope of the spirit of the invention.

On the other hand, the out diffusion preventing film is not also limited to the BPT shown in the above embodiments but can be used to manufacture other semiconductor devices within the scope of the spirit of the invention.

I claim:

1. A method of manufacturing a semiconductor device, comprising the steps of:

forming an insulative film onto a semiconductor substrate;

forming a plurality of openings in the insulative film, each opening exposing a respective one of a plurality of surfaces of the semiconductor substrate corresponding to a region to be subjected to impurity implantation;

implanting impurities into the semiconductor substrate through the openings;

forming a respective plurality of out diffusion preventing films on each of the surfaces after the impurities have been implanted, each plurality of out diffusion preventing films being formed in a layered structure having a respective uppermost out diffusion preventing film, and all of the out diffusion preventing films being conductive;

annealing, at an annealing temperature, the semiconductor substrate after the out diffusion preventing films have been formed so as to activate the implanted impurities; and forming a conductive layer on the uppermost out diffusion preventing film for each respective surface.

2. A method according to claim 1, wherein the out diffusion preventing film comprise a barrier metal.

3. A method according to claim 1, wherein the out diffusion preventing film comprise silicide.

4. A method according to claim 1, wherein the out diffusion preventing film comprise a conductive material have a melting point at a temperature which is higher than the annealing temperature.

5. A method according to claim 1, wherein the out diffusion preventing film are formed by sputtering or reactive sputtering.

6. A method according to claim 1, wherein the out diffusion preventing film comprise a barrier metal and silicide.

7. A method according to claim 6, wherein a ratio of film thickness of the barrier metal and the silicide is set to a value within a range from 1:4 to 1:5.

8. A method according to claim 1, wherein the out diffusion preventing films on the side of an interface with the semiconductor substrate are simultaneously processed by said annealing step to form silicide.

9. A method of manufacturing a semiconductor device which forms an emitter region by a self alignment by using an emitter electrode lead-out opening portion, comprising the steps of:

forming an insulating layer on a surface of a semiconductor layer;

etching the insulating layer to form an opening through the insulating layer to expose the surface of the semiconductor layer through the opening at a region of the semiconductor layer intended to operate as an emitter region;

implanting impurities into the semiconductor layer through the opening;

forming a plurality of out diffusion preventing films on the surface of the semiconductor layer exposed through the opening after said implanting step, the plurality of out diffusion preventing films being formed in a layered structure having an uppermost out diffusion preventing film, and all of the out diffusion preventing films being conductive;

annealing, at an annealing temperature, the plurality of out diffusion preventing films so as to activate the implanted impurities; and forming a main wiring layer on the uppermost out diffusion preventing film such that the main wiring layer and the plurality of out diffusion preventing layers form a layered wiring structure in which the plurality of out diffusion layers operate as lower wiring layers.

10. A method according to claim 9, wherein the out diffusion preventing film comprise a barrier metal.

11. A method according to claim 9, wherein the out diffusion preventing film comprise silicide.

12. A method according to claim 9, wherein the out diffusion preventing film comprise a conductive material having a melting point at a temperature which is higher than the annealing temperature.

13. A method according to claim 9, wherein the out diffusion preventing films are formed by sputtering or reactive sputtering.

14. A method according to claim 9, wherein the out diffusion preventing film comprise a barrier metal and silicide.

15. A method according to claim 14, wherein a ratio of film thickness of the barrier metal and the silicide is set to a value within a range from 1:4 to 1:5.

16. A method according to claim 9, wherein the out diffusion preventing films on the side of an interface with the semiconductor substrate are simultaneously processed by said annealing step to form silicide.

17. A method of manufacturing a semiconductor device, comprising the steps of:

forming regions serving as a base region and a collector region into a semiconductor substrate;

forming an insulative layer on the surface of the semiconductor substrate after said region forming step;

forming a first plurality of openings in the insulative layer corresponding to the base region, the collector region, and an emitter region, respectively;

forming a resist on the insulative layer so as to have a second plurality of openings respectively corresponding to the openings of the first plurality of openings formed corresponding to the collector and emitter regions;

implanting impurities into the semiconductor substrate through the second plurality of openings of the resist and through the first plurality of openings of the insulative layer and eliminating the resist after said implanting step;

forming an out diffusion preventing film including (1) at least a Ti layer and a TiN layer, (2) a Ti layer and a TiSi$_2$ layer, or (3) a TiN layer and a TiSi$_2$ layer on portions of the semiconductor substrate corresponding to at least the first plurality of openings of the insulative layer and annealing, at an annealing temperature, the output diffusion preventing film so as to activate the implanted impurities after said out diffusion film preventing film forming step;

forming a conductive material serving as a wiring material onto the out diffusion preventing film; and patterning the out diffusion preventing film and the conductive material.

18. A method according to claim 17, wherein the out diffusion preventing film comprises a barrier metal.

19. A method according to claim 17, wherein the out diffusion preventing film comprises silicide.

20. A method according to claim 17, wherein the out diffusion preventing film comprises a conductive material having a melting point at a temperature which is higher than the annealing temperature.

21. A method according to claim 17, wherein the out diffusion preventing film is formed by sputtering or reactive sputtering.

22. A method according to claim 17, wherein the out diffusion preventing film comprises a plurality of layers.

23. A method according to claim 22, wherein the plurality of out diffusion preventing film layers comprise a barrier metal and silicide.

24. A method according to claim 23, wherein a ratio of film thickness of the barrier metal and the silicide is set to a value within a range from 1:4 to 1:5.

25. A method according to claim 17, wherein the out diffusion preventing film on the side of an interface with the semiconductor substrate is simultaneously processed by said annealing step to form silicide.

* * * * *

UNITED STATES PATENT AND TRADEMARK OFFICE
CERTIFICATE OF CORRECTION

PATENT NO. : 5,686,323

DATED : November 11, 1997

INVENTOR(S): YUZO KATAOKA

It is certified that error appears in the above-identified patent and that said Letters Patent is hereby corrected as shown below:

COLUMN 1

Line 32, "1" should read --1 and--;
Line 32, "is" should read --are--.

COLUMN 2

Line 14, "type" should read --type of the--;
Line 23, "ensure," should read --ensure--.

COLUMN 7

Line 5, "3C)." should read --3C.--.

COLUMN 8

Line 11, "film" should read --films--;
Line 13, "film" should read --films--;
Line 15, "film" should read --films--;
Line 16, "have" should read --having--;
Line 19, "film" should read --films--;
Line 22, "film" should read --films--;
Line 61, "film" should read --films--;
Line 63, "film" should read --films--;
Line 65, "film" should read --films--.

UNITED STATES PATENT AND TRADEMARK OFFICE
CERTIFICATE OF CORRECTION

PATENT NO. : 5,686,323

DATED : November 11, 1997

INVENTOR(S): YUZO KATAOKA

Page 2 of 2

It is certified that error appears in the above-identified patent and that said Letters Patent is hereby corrected as shown below:

COLUMN 9

Line 5, "film" should read --films--.

Signed and Sealed this

Twenty-fifth Day of August, 1998

Attest:

BRUCE LEHMAN

Attesting Officer

Commissioner of Patents and Trademarks